(12) United States Patent
Lee et al.

(10) Patent No.: US 9,076,978 B2
(45) Date of Patent: Jul. 7, 2015

(54) ORGANIC LIGHT EMITTING DIODE DEVICE

(71) Applicant: Samsung Display Co., Ltd., Yongin, Gyeonggi-Do (KR)

(72) Inventors: Min-Woo Lee, Yongin (KR); Young-Mo Koo, Yongin (KR); Jae-Goo Lee, Yongin (KR); Woo-Sik Jeon, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 14/040,935

(22) Filed: Sep. 30, 2013

(65) Prior Publication Data

US 2014/0291631 A1 Oct. 2, 2014

(30) Foreign Application Priority Data

Apr. 1, 2013 (KR) .......................... 10-2013-0035254

(51) Int. Cl.
*H01L 51/54* (2006.01)
*H01L 51/50* (2006.01)
*H01L 27/32* (2006.01)

(52) U.S. Cl.
CPC .............. *H01L 51/508* (2013.01); *H01L 51/504* (2013.01); *H01L 27/3213* (2013.01); *H01L 27/3209* (2013.01); *H01L 27/322* (2013.01)

(58) Field of Classification Search
CPC ............ H01L 51/5044; H01L 51/5064; H01L 51/508
USPC .............................................. 257/40; 438/99
See application file for complete search history.

(56) References Cited

U.S. PATENT DOCUMENTS

| 8,471,247 B2 * | 6/2013 | Dobbs et al. ..................... 257/40 |
| 2006/0029828 A1 * | 2/2006 | Kanno et al. .................. 428/690 |

(Continued)

FOREIGN PATENT DOCUMENTS

| KR | 10-2008-0009528 | 1/2008 |
| KR | 10-2011-0035048 | 4/2011 |
| KR | 10-2012-0042038 | 5/2012 |

OTHER PUBLICATIONS

Choi et al. Improved Efficiency and Lifetime of Organic Light-Emitting Diode with Lithium-Quinolate-Doped Electron Transport Layer, Pub. online Jun. 22, 2009, Japanese Journal of Applied Physics 48 (2009), 062101-1 to 062101-3.*

(Continued)

*Primary Examiner* — Allan R Wilson
(74) *Attorney, Agent, or Firm* — Robert E. Bushnell, Esq.

(57) ABSTRACT

An organic light emitting diode device includes a first electrode and a second electrode facing each other, a charge-generating layer interposed between the first electrode and the second electrode, a first light emitting unit that emits blue and is interposed between the first electrode and the charge-generating layer, and a second light emitting unit that emits white by combining the blue and is interposed between the second electrode and the charge-generating layer. The first light emitting unit includes a blue emission layer, a first charge transport layer disposed on one side of the blue emission layer and including an alkali metal complex compound and a first charge transport material, and a second charge transport layer disposed on one side of the first charge transport layer and including the alkali metal complex compound and a second charge transport material that has different charge mobility from the first charge transport material.

12 Claims, 3 Drawing Sheets

(56) References Cited

U.S. PATENT DOCUMENTS

| | | |
|---|---|---|
| 2011/0057179 A1* | 3/2011 | Nowatari et al. ............... 257/40 |
| 2011/0073844 A1* | 3/2011 | Pieh et al. ....................... 257/40 |
| 2011/0121320 A1* | 5/2011 | Pieh et al. ....................... 257/79 |
| 2011/0240972 A1* | 10/2011 | Nowatari et al. ............... 257/40 |
| 2012/0097998 A1* | 4/2012 | Pieh et al. ....................... 257/89 |
| 2012/0326132 A1* | 12/2012 | Ko et al. .......................... 257/40 |
| 2013/0112949 A1* | 5/2013 | Sim et al. ........................ 257/40 |
| 2013/0119357 A1 | 5/2013 | Kim et al. |
| 2014/0117337 A1* | 5/2014 | Jung et al. ....................... 257/40 |
| 2014/0361271 A1* | 12/2014 | Forrest et al. ................... 257/40 |
| 2015/0001499 A1* | 1/2015 | Kim et al. ....................... 257/40 |

OTHER PUBLICATIONS

Yonghua Chen et al., High power efficiency tandem organic light-emitting diodes based on bulk heterojunction organic bipolar charge generation layer, Applied Physics Letters, 98, 243309 (2011), published online Jun. 17, 2011, American Institute of Physics.

* cited by examiner

FIG. 2

| B | W | B | W | B |
|---|---|---|---|---|
| G | R | G | R | G |
| B | W | B | W | B |
| G | R | G | R | G |
| B | W | B | W | B |

ORGANIC LIGHT EMITTING DIODE DEVICE

CLAIM OF PRIORITY

This application makes reference to, incorporates the same herein, and claims all benefits accruing under 35 U.S.C. §119 from an application earlier filed in the Korean Intellectual Property Office on 1 Apr. 2013 and there duly assigned Serial No. 10-2013-0035254.

BACKGROUND OF THE INVENTION

1. Field of the Invention

Embodiments of the present invention relate to an organic light emitting diode device, and more specifically, to an organic light emitting diode device displaying stable white light due to improvement of blue luminous efficiency.

2. Description of the Related Art

An organic light emitting diode (OLED) device has recently been drawing attention as a display device and a luminous device.

An organic light emitting diode device in general includes two electrodes and an emission layer disposed therebetween, and emits light when electrons injected from one electrode are combined with holes injected from the other electrode and thus forms excitons and releases energy.

Since the organic light emitting diode device is a self light-emitting type device with no separate light source, it has an advantage of faster response speed, wider viewing angle, and better contrast ratio as well as less power consumption.

On the other hand, an organic light emitting diode device includes a plurality of sub-pixels such as red, blue, and green sub-pixels and the like in each pixel, and may display full colors by combining them.

Herein, the red, blue, and green sub-pixels respectively include red, blue, and green emission layers and may display respective color. These emission layers may be deposited in each sub-pixel using a fine shadow mask. As a display device becomes larger, however, there is a limit in depositing an emission layer per each sub-pixel using a fine shadow mask.

Therefore, a technology of emitting white light by sequentially accumulating red, blue, and green emission layers over all of a display device using an open mask, and then displaying red, green, and blue per each sub-pixel by putting a color implementing means such as a color filter where the emitted light passes has been suggested.

Such a white light emitting device however has a limit in terms of color characteristics and efficiency due to a limit of a blue light emitting material.

The above information disclosed in this Background section is only for enhancement of understanding of the background of the described technology and therefore it may contain information that does not form the prior art that is already known in this country to a person of ordinary skill in the art.

SUMMARY OF THE INVENTION

One embodiment provides an organic light emitting diode device displaying stable white due to improvement of blue luminous efficiency.

According to one embodiment, an organic light emitting diode device includes a first electrode and a second electrode facing each other, a charge-generating layer interposed between the first electrode and the second electrode, a first light emitting unit that emits blue and is interposed between the first electrode and the charge-generating layer, and a second light emitting unit that emits a white-displaying color by combining the blue and is interposed between the second electrode and the charge-generating layer. The first light emitting unit includes a blue emission layer, a first charge transport layer disposed on one side of the blue emission layer and including an alkali metal complex compound and a first charge transport material, and a second charge transport layer disposed on one side of the first charge transport layer and including the alkali metal complex compound and a second charge transport material that has different charge mobility from the first charge transport material.

The first charge transport material may have higher charge mobility than that of the second charge transport material.

The charge mobility of the first charge transport material may be about 1.1 to about 100 times higher than that of the second charge transport material.

The alkali metal complex compound may include lithium quinolate (Liq).

The organic light emitting diode device may further include a charge injection layer interposed between the second charge transport layer and the charge-generating layer, and the charge injection layer may include lithium fluoride (LiF), lithium quinolate (Liq), or a combination thereof.

The second light emitting unit may include an emission layer that emits light in a wavelength region of about 550 to about 650 nm.

The second light emitting unit may include a red emission layer and a green emission layer that are stacked sequentially.

The red emission layer may include a compound having hole transport characteristics, and the green emission layer may include a compound having electron transport characteristics.

The red emission layer may include a triphenylamine derivative, and the green emission layer may include a carbazole derivative, a spirofluorene derivative, or a combination thereof that has at least one of a triazine group and an oxadiazole group.

The second light emitting unit may include an emission layer including a host material doped with a red light emitting material and a green light emitting material.

The first light emitting unit may include a blue emission layer including a fluorescent material, and the second light emitting unit may include an emission layer including a phosphorescent material.

The first electrode may be an anode and the second electrode may be a cathode.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 2 is a top plan view exemplarily showing arrangement of a plurality of pixels in an organic light emitting diode device according to one embodiment.

DETAILED DESCRIPTION OF THE INVENTION

Figure 1:
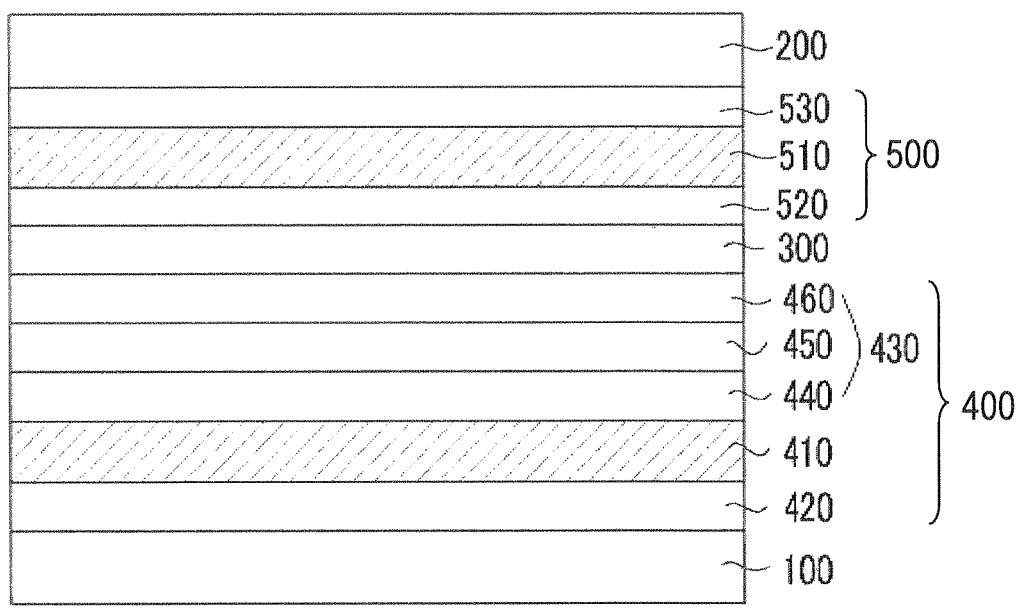
FIG. 1 is a cross-sectional view showing an organic light emitting diode device according to one embodiment.

This disclosure will be described more fully hereinafter with reference to the accompanying drawings, in which exemplary embodiments are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, an organic light emitting diode device according to one embodiment is illustrated referring to FIG. 1.

FIG. 1 is a cross-sectional view of an organic light emitting diode device according to one embodiment.

In reference to FIG. 1, the organic light emitting diode device according to one embodiment includes a lower electrode 100, an upper electrode 200, a charge-generating layer 300 interposed between the lower electrode 100 and the upper electrode 200, a first light emitting unit 400 emitting blue and being interposed between the lower electrode 100 and the charge-generating layer 300, and a second light emitting unit 500 emitting a color that displays white by combining the blue and being interposed between the upper electrode 200 and charge-generating layer 300.

One of the lower electrode 100 and the upper electrode 200 is a cathode and the other is an anode. For example, the lower electrode 100 may be an anode and the upper electrode 200 may be a cathode.

At least one of the lower electrode 100 and the upper electrode 200 may be a transparent electrode. When the lower electrode 100 is a transparent electrode, a bottom emission in which light emits downward is realized, and when the upper electrode 200 is a transparent electrode, a top emission in which light emits upward is realized. In addition, when the lower electrode 100 and upper electrode 200 are all transparent electrodes, both-side emission in which light is emitted downward and upward is realized. The transparent electrode may be ITO, IZO, or a combination thereof, and may also be formed of aluminum (Al), silver (Ag), or a combination thereof at a thin thickness.

When the lower electrode 100 or upper electrode 200 is an opaque electrode, it may be made of an opaque metal such as aluminum (Al), silver (Ag), and the like.

The charge-generating layer 300 may generate electron-hole pairs, and the generated holes may be transported to one light emitting unit and the generated electrons may be transported to the other light emitting unit. For example, when the lower electrode 100 is an anode and the upper electrode 200 is a cathode, electrons generated in the charge-generating layer 300 move to the first light emitting unit 400 and form excitons with holes injected from the lower electrode 100, while holes move to the second light emitting unit 500 and form excitons with electrons injected from the upper electrode 200.

The first light emitting unit 400 and the second light emitting unit 500 may display different colors from each other, and lights emitted from the first light emitting unit 400 and the second light emitting unit 500 may be combined to emit white.

The first light emitting unit 400 includes a blue emission layer 410 emitting light of a blue wavelength region, a lower auxiliary layer 420 disposed under the blue emission layer 410, and an upper auxiliary layer 430 disposed above the blue emission layer 410.

The blue emission layer 410 may include, for example a blue light emitting material. The blue light emitting material may be, for example a fluorescent or phosphorescent material.

The lower auxiliary layer 420 may improve charge mobility between the lower electrode 100 and the blue emission layer 410, and may be, for example a hole injection layer, a hole transport layer, or a combination thereof when the lower electrode 100 is an anode. The auxiliary layer 420 may be a monolayer or a plural layer and may be omitted as needed.

The upper auxiliary layer 430 improves charge mobility between the charge-generating layer 300 and the blue emission layer 410, and may include a first charge transport layer 440 positioned on one side of blue emission layer 410, and a second charge transport layer 450 positioned on one side of the first charge transport layer 440, and a charge injection layer 460.

The first charge transport layer 440 and the second charge transport layer 450 include an alkali metal complex compound in common and include a charge transport material having different charge mobility from each other. That is to say, the first charge transport layer 440 may include an alkali metal complex compound and a first charge transport material, and the second charge transport layer 450 may include the same alkali metal complex compound and a second charge transport material having different charge mobility from the first charge transport material.

The alkali metal complex compound may include lithium quinolate (Liq). When such a lithium quinolate (Liq) are included in common, charge mobility of the two layers may be controlled easily to improve efficiency.

The first charge transport layer 440 may be adjacently positioned on the blue emission layer 410 and thus, increase luminous efficiency of the blue emission layer 410. The first charge transport material included in the first charge transport layer 440 may have a similar energy level to the blue light emitting material included in the blue emission layer 410, herein the energy level may be a HOMO energy level and a triplet energy level. For example, the first charge transport material and the blue light emitting material may have a HOMO energy level difference ranging from about 0 to about 0.5 eV and a triplet energy level ranging from about 0 to about 0.5 eV.

The second charge transport layer 450 may be positioned adjacent to the charge-generating layer 300. The second charge transport material included in the second charge transport layer 450 may have the same energy level as or similar as to a charge transport material included in the charge-generating layer 300. For example, the second charge transport material and the charge transport material may have a LUMO level difference ranging from about 0 to about 0.2 eV.

Herein, the first charge transport material may have higher charge mobility than the second charge transport material first charge transport material, and for example, the charge mobility of the first charge transport material may be about 1.1 to about 100 times higher than that of the second charge transport material.

The first and second charge transport materials may be, for example, a charge transport material having different charge mobility from each other or have a different substituent with the same or a similar core structure and thus, different charge mobility.

For example, the first and second charge transport materials may include pyridine, pyrimidine, pyrazine, triazine, oxadiazole, triazole, imidazole, benzimidazole, aryl borane, silylole, or a combination thereof, in common, which may be substituted with a polar substituent or a non-polar substituent to adjust charge mobility.

In this way, the first charge transport layer 440 and the second charge transport layer 450 respectively include a charge transport material having different charge mobility from each other and may effectively improve current and light emitting characteristics of a blue light emitting unit.

The first charge transport layer 440 may include the alkali metal complex compound and the first charge transport material in a weight ratio of about 0.01:99.99 to about 99.99:0.01, and the second charge transport layer 450 may include the alkali metal complex compound and the second charge transport material in a weight ratio of about 0.01:99.99 to about 99.99:0.01.

The charge injection layer 460 may include, for example lithium fluoride (LiF), lithium quinolate (Liq), or a combination thereof. The charge injection layer 460 may be omitted as needed.

The second light emitting unit 500 includes an emission layer 510 that emits a white-displaying color by combining the blue, a lower auxiliary layer 520 disposed under the emission layer 510, and an upper auxiliary layer 530 disposed above the emission layer 510.

The emission layer 510 may emit light in a wavelength region of about 550 nm to about 650 nm and for example, may be a monolayer emitting one color or plural layers stacked two or more layers emitting different colors each other.

When the emission layer 510 is a monolayer, the emission layer 510 may be formed of a light emitting material emitting orange light in a wavelength region ranging from about 550 to about 650 nm. In addition, the emission layer 510 may be formed by doping red and green light emitting materials in a monolayer including a host material. Herein, the host material may be a host material for a green emission layer and have higher triplet energy than a green dopant. The dopant may be a phosphorescent material.

When the emission layer 510 is plural layers, a red emission layer emitting light in a red wavelength region and a green emission layer emitting light in a green wavelength region may be stacked therein. Herein, the red emission layer may have hole transport characteristics, and the green emission layer may have electron transport characteristics. A host for the red emission layer may include a triphenylamine derivative, and a host for the green emission layer may include a carbazole derivative, a spirofluorene derivative, or a combination thereof including at least one of a triazine group and an oxadiazole group.

The aforementioned organic light emitting diode device may include a plurality of pixels, and each pixel may include a plurality of sub-pixels. In reference to FIGS. 2 and 3, more detailed descriptions are provided.

Figure 2:
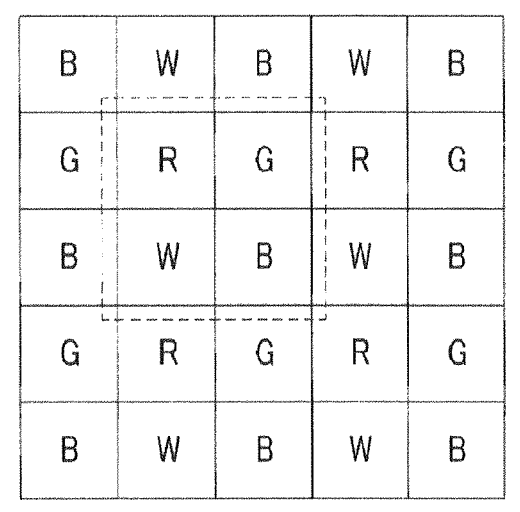
Figure 3:
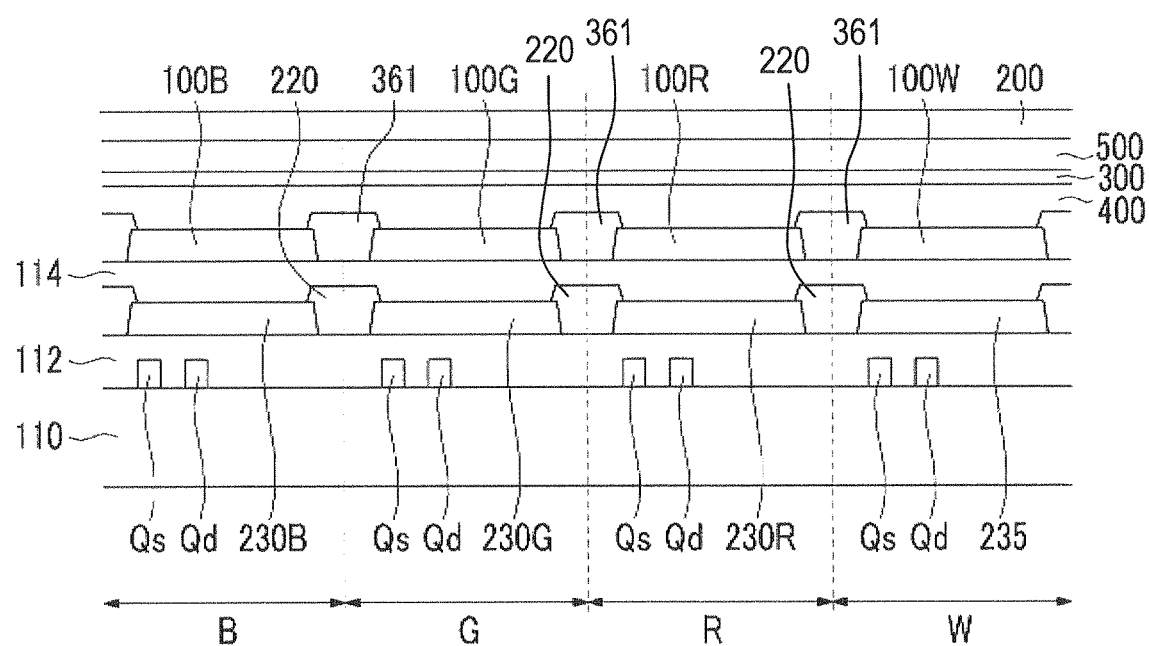
FIG. 3 is a cross-sectional view showing the structure of the organic light emitting diode device of FIG. 2.

FIG. 2 is a top plan view exemplarily showing arrangement of a plurality of pixels in an organic light emitting diode device according to one embodiment, and FIG. 3 is a cross-sectional view showing a structure of the organic light emitting diode device of FIG. 2.

First, in reference to FIG. 2, a red sub-pixel (R) displaying red, a green sub-pixel (G) displaying green, a blue sub-pixel (B) displaying blue, and white sub-pixel (W) displaying no color are alternatively arranged in the organic light emitting diode device according to one embodiment.

The red sub-pixel (R), the green sub-pixel (G), and the blue sub-pixel (B) are primary pixels for displaying full color. The white sub-pixel (W) may increase the light transmission to enhance the luminance of device.

Four sub-pixels including the red sub-pixel (R), the green sub-pixel (G), the blue sub-pixel (B), and the white sub-pixel (W) may form one pixel group and repeat along with a row and/or a column. However, the arrangement of pixel may be variously changed.

In reference to FIG. 3, the structure of organic light emitting diode device including red sub-pixel (R), green sub-pixel (G), blue sub-pixel (B), and white sub-pixel (W) is described.

A plurality of thin film transistor arrays is disposed on an insulation substrate 110. The thin film transistor array includes a switching thin film transistor (Qs) and a driving thin film transistor (Qd) which are disposed in each sub-pixel and are electrically connected with each other. Although one switching thin film transistor (Qs) and one driving thin film transistor (Qd) are exemplarily illustrated in each sub-pixel in FIG. 2, it is not limited thereto, but they may be included in various number in each sub-pixel.

A lower insulation layer 112 is disposed on the thin film transistor array. In the lower insulation layer 112, a plurality of contact holes (not shown) are formed for partially exposing the switching thin film transistor (Qs) and the driving thin film transistor (Qd).

On the lower insulation layer 112, a red color filter 230R is disposed in the red sub-pixel (R); a green color filter 230G is disposed in the green sub-pixel (G); and a blue color filter 230B is disposed in the blue sub-pixel (B). The color filters 230R, 230G, and 230B may be disposed, for example, according to a color filter on array (CoA) manner.

In the white sub-pixel (W), a transparent insulation layer 235 is formed instead of the color filter in order to adjust steps with color filters of other sub-pixels. However, the transparent insulation layer 235 may be omitted.

Light blocking members 220 are disposed each between the red filter 230R, green filter 230G, blue filter 230B, and transparent insulation layer 235. The light blocking members 220 may block the light leakage each between sub-pixels.

An upper insulation layer 114 may be formed on the red filter 230R, green filter 230G, blue filter 230B, transparent insulation layer 235, and light blocking member 220. In the upper insulation layer 114, a plurality of contact holes (not shown) may be formed.

Pixel electrodes 100R, 100G, 100B, and 100W are formed on the upper insulation layer 114. The pixel electrodes 100R, 100G, 100B, and 100W are electrically connected to the driving thin film transistor Qd through the contact hole (not shown) and may act as an anode.

A plurality of insulating members 361 for defining each sub-pixel are disposed on each pixel electrodes 100R, 100G, 100B, and 100W, and as shown in FIG. 1, a first light emitting unit 400, a charge-generating layer 300 and a second light emitting unit 500 are formed on the pixel electrodes 100R, 100G, 100B, and 100W and the insulation member 361. The first light emitting unit 400 and the second light emitting unit 500 may combined to display white.

A common electrode 200 is formed on the second light emitting unit 500. The common electrode 200 may be formed on the entire surface of substrate and may be a cathode. The common electrode 200 is paired with pixel electrodes 100R, 100G, 100B, and 100W to flow current into the first light emitting unit 400 and the second light emitting unit 500.

Hereinafter, the present disclosure is illustrated in more detail with reference to examples. However, these examples are exemplary, and the present disclosure is not limited thereto.

Manufacture of Organic Light Emitting Diode

Example 1

An ITO was sputtered on a glass substrate and patterned to form an ITO anode. On the ITO anode, a fluorene derivative and ELM229 (ELM Inc.) were sequentially vacuum-deposited to form a hole injection layer (HIL) and a hole transport layer (HTL). On the hole transport layer (HTL), ABH114 (SFC Inc.) was vacuum-deposited to form a blue emission layer. Then, lithium quinolate (Liq) and ETM521 (Hodogaya Chemical Co.) (a primary ETL material) (charge mobility of $2.5 \times 10^{-4}$ V/cm$^2$) were deposited in a weight ratio of 5:5 weight ratio to form a first charge transport layer, and lithium quinolate (Liq) and L201 (LG Chem Ltd.) (a secondary ETL material) (charge mobility of $1.4 \times 10^{-4}$ V/cm$^2$) were deposited in a weight ratio of 5:5 thereon to form a second charge transport layer. Then, L201 (LG Chem Ltd.) and Li were co-deposited to form a charge-generating layer, and ELM229 (ELM Inc.), a phosphorescent red light emitting material, a phosphorescent green light emitting material, and L201 (LG Chem Ltd.) were sequentially deposited on the charge-generating layer, and then an Al cathode was formed, manufacturing an organic light emitting diode.

Comparative Example 1

An organic light emitting diode was manufacture according to the same method as Example 1 except for forming no first charge transport layer.

Example 2

An organic light emitting diode was manufactured according to the same method as Example 1, except for additionally forming an electron injection layer (EIL) by depositing lithium fluoride (LiF) after forming the second charge transport layer.

Comparative Example 2

An organic light emitting diode was manufactured according to the same method as Example 2, except for forming no first charge transport layer.

Evaluation 1

Driving voltage, efficiency, and color characteristics of the organic light emitting diodes according to Examples 1 and 2 and Comparative Examples 1 and 2 at the same luminance (550 nit) were evaluated.

The results are provided in Table 1.

TABLE 1

| @550 nit | Driving voltage (V) | Current efficiency (cd/A) | Electric power efficiency (lm/W) | External quantum efficiency (EQE) | C.B |
|---|---|---|---|---|---|
| Example 1 | 4.31 | 7.3 | 5.3 | 7.5 | 68.5 |
| Comparative Example 1 | 4.43 | 6.2 | 4.4 | 6.4 | 58.2 |
| Example 2 | 4.13 | 9.0 | 6.9 | 9.1 | 81.9 |
| Comparative Example 2 | 4.42 | 7.4 | 5.3 | 7.4 | 67.2 |

* C.B (Conversion Blue) = current efficiency (cd/A)/blue Y color coordinate

In reference to Table 1, the organic light emitting diode according to Example 1 had all improved driving voltage, current efficiency, electric power efficiency, external quantum efficiency, and conversion blue compared with the organic light emitting diode according to Comparative Example 1, and the organic light emitting diode according to Example 2 had all improved driving voltage, current efficiency, electric power efficiency, external quantum efficiency, and conversion blue compared with the organic light emitting diode according to Comparative Example 2.

Evaluation 2

Driving voltage, luminescence characteristics, efficiency, and color characteristics of the organic light emitting diodes according to Examples 1 and 2 and Comparative Examples 1 and 2 at the same current density (10 mA/cm$^2$) were evaluated.

The results are provided in Table 2.

TABLE 2

| @10 mA/cm$^2$ | Driving voltage (V) | Luminance (nit) | Current efficiency (cd/A) | Electric power efficiency (lm/W) | External quantum efficiency (EQE) | Conversion blue |
|---|---|---|---|---|---|---|
| Example 1 | 4.41 | 732 | 7.3 | 5.2 | 7.6 | 69.5 |
| Comparative Example 1 | 4.47 | 621 | 6.2 | 4.4 | 6.4 | 58.5 |
| Example 2 | 4.32 | 908 | 9.1 | 6.6 | 9.2 | 82.5 |
| Comparative Example 2 | 4.53 | 754 | 7.5 | 5.2 | 7.6 | 68.5 |

In reference to Table 2, the organic light emitting diode according to Example 1 had all improved driving voltage, luminance, current efficiency, electric power efficiency, external quantum efficiency, and conversion blue compared with the organic light emitting diode according to Comparative Example 1, and the organic light emitting diode according to Example 2 had all improved driving voltage, current efficiency, electric power efficiency, external quantum efficiency, and conversion blue compared with the organic light emitting diode according to Comparative Example 2.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. An organic light emitting diode device, comprising:
   a first electrode and a second electrode facing each other,
   a charge-generating layer interposed between the first electrode and the second electrode,
   a first light emitting unit that emits blue only and is interposed to immediately contact with the first electrode and the charge-generating layer, and
   a second light emitting unit that emits a white-displaying color by combining the blue and is interposed between the second electrode and the charge-generating layer,
   wherein the first light emitting unit comprises:
   a blue emission layer,
   a first charge transport layer disposed on one side of the blue emission layer and including an alkali metal complex compound and a first charge transport material, and
   a second charge transport layer disposed on one side of the first charge transport layer and including the alkali metal complex compound and a second charge transport mate- rial that has a charge mobility different from that of the first charge transport material.

2. The organic light emitting diode device of claim 1, wherein the first charge transport material has higher charge mobility than the second charge transport material.

3. The organic light emitting diode device of claim 2, wherein the charge mobility of the first charge transport material is about 1.1 to about 100 times higher than that of the second charge transport material.

4. The organic light emitting diode device of claim 1, wherein the alkali metal complex compound comprises lithium quinolate (Liq).

5. The organic light emitting diode device of claim 1, further comprising a charge injection layer interposed between the second charge transport layer and the charge-generating layer, and
the charge injection layer comprises lithium fluoride (LiF), lithium quinolate (Liq), or a combination thereof.

6. The organic light emitting diode device of claim 5, wherein the second light emitting unit comprises an emission layer that emits light in a wavelength region of about 550 to about 650 nm.

7. The organic light emitting diode device of claim 6, wherein the second light emitting unit comprises a red emission layer and a green emission layer that are stacked sequentially.

8. The organic light emitting diode device of claim 7, wherein the red emission layer comprises a compound having hole transport characteristics, and
the green emission layer comprises a compound having electron transport characteristics.

9. The organic light emitting diode device of claim 8, wherein the red emission layer comprises a triphenylamine derivative, and
the green emission layer comprises a carbazole derivative, a spirofluorene derivative, or a combination thereof that has at least one of a triazine group and an oxadiazole group.

10. The organic light emitting diode device of claim 6, wherein the second light emitting unit comprises an emission layer including a host material doped with a red light emitting material and a green light emitting material.

11. The organic light emitting diode device of claim 1, wherein the first light emitting unit comprises a blue emission layer including a fluorescent material, and
the second light emitting unit comprises an emission layer including a phosphorescent material.

12. The organic light emitting diode device of claim 1, wherein the first electrode is an anode and the second electrode is a cathode.

* * * * *